United States Patent [19]

Fukunaga et al.

[11] Patent Number: 4,971,921

[45] Date of Patent: Nov. 20, 1990

[54] SEMICONDUCTOR DEVICE AND METHOD OF MANUFACTURING THE SAME

[75] Inventors: Masanori Fukunaga; Gourab Majumdar, both of Itami, Japan

[73] Assignee: Mitsubishi Denki Kabushiki Kaisha, Tokyo, Japan

[21] Appl. No.: 440,213

[22] Filed: Nov. 22, 1989

Related U.S. Application Data

[62] Division of Ser. No. 202,469, Jun. 6, 1988, Pat. No. 4,903,106.

[30] Foreign Application Priority Data

Sep. 28, 1987 [JP] Japan .................. 62-243063

[51] Int. Cl.⁵ .............................. H01L 21/70
[52] U.S. Cl. .......................... 437/29; 437/31; 437/40; 437/7
[58] Field of Search ............ 437/29, 40, 41, 30, 437/31, 3, 7, 51; 357/234, 28, 34, 43

[56] References Cited

U.S. PATENT DOCUMENTS

| | | | |
|---|---|---|---|
| 4,142,115 | 2/1979 | Nayata et al. | 357/28 X |
| 4,242,598 | 12/1980 | Johnson et al. | 357/28 X |
| 4,260,911 | 4/1981 | Brown, Jr. et al. | 357/28 X |
| 4,417,385 | 11/1983 | Temple | 437/29 |
| 4,574,205 | 3/1986 | Nagano | 357/28 X |
| 4,730,228 | 3/1988 | Einzinger et al. | 357/28 X |
| 4,760,434 | 7/1988 | Tsuzuki et al. | 357/28 X |
| 4,774,198 | 9/1988 | Contieno et al. | 437/29 |
| 4,902,636 | 2/1990 | Akiyama et al. | 437/29 |

FOREIGN PATENT DOCUMENTS

| | | |
|---|---|---|
| 0208970 | 1/1987 | European Pat. Off. . |
| 0224274 | 6/1987 | European Pat. Off. . |
| 2644597 | 4/1978 | Fed. Rep. of Germany . |
| 3007403 | 9/1980 | Fed. Rep. of Germany . |
| 632610 | 10/1982 | Switzerland . |
| 1444164 | 7/1976 | United Kingdom . |
| 2047956 | 12/1980 | United Kingdom . |
| 2195507 | 4/1988 | United Kingdom . |
| 8503819 | 8/1985 | World Int. Prop. O. . |

OTHER PUBLICATIONS

Motorola: Smartpower Technical Overview and Applications Information.

*Primary Examiner*—Brian E. Hearn
*Assistant Examiner*—T. Thomas
*Attorney, Agent, or Firm*—Oblon, Spivak, McClelland, Maier & Neustadt

[57] ABSTRACT

The present invention relates to a semiconductor device employed for high power use and a method of manufacturing the same. According to the present invention, a temperature detecting device is formed on the same substrate with a power device. Thus, there is no need to add an external temperature sensor, whereby the device can be reduced in size. Further, an abnormal temperature of the power device is accurately detected by the temperature detecting device, whereby thermal breakdown of the power device is reliably prevented.

3 Claims, 13 Drawing Sheets

BASE-TO-EMITTER VOLTAGE

SEMICONDUCTOR DEVICE AND METHOD OF MANUFACTURING THE SAME

This is a division of application Ser. No. 07/202,469, filed on June 6, 1988, now U.S. Pat. No. 4,903,106.

BACKGROUND OF THE INVENTION

1. Field of the Invention

The present invention relates to a semiconductor device and a method of manufacturing the same, and more particularly, it relates to technique of preventing thermal breakdown following a temperature rise in a power device.

2. Description of the Related Art

In a power device employed for high power use, a temperature protection network is generally utilized in order to prevent thermal breakdown following an excess temperature rise. FIG. 20 shows an example of such a conventional temperature protection network. As shown in FIG. 20, a power device 1 is formed by an enhancement type n-channel field effect transistor and a diode 3 connected in parallel between a source and a drain of the field effect transistor 2. The source of the field effect transistor 2 is grounded and the drain thereof is connected to a DC power supply $V_{DC}$ through a load 4. A control signal IN is inputted in the gate of the transistor 2 through a driver 5, to thereby perform voltage control of the power device 1. In this case, the power device 1 is controlled by an on-off control system employing a binary level signal as the control signal IN or a pulse width modulation control system employing a pulse shape signal. On the other hand, a temperature sensor 6 such as a thermocouple is separately provided in the vicinity of the power device 1, in order to detect the temperature of the power device. A temperature measuring signal, having a voltage value relating to a measuring temperature outputted from the temperature sensor 6, is inputted in an error amplifier 7. The error amplifier 7 compares a temperature detecting signal received from the temperature sensor 6 with reference voltage 8, to output an abnormal temperature detecting signal when the temperature of the power device 71 rises to a prescribed abnormal temperature level to supply the abnormal temperature detecting signal to another input terminal of the driver 5.

Operation of the temperature protection network thus structured is as follows: When the power device is in a normal temperature range, the error amplifier outputs no abnormal temperature detecting signal, and hence the control signal IN directly passes through the driver 5 to be supplied to the gate of the transistor 2, thereby to continue operation by the power device 1. When the temperature of the power device 1 exothermically rises to the prescribed abnormal temperature level, the abnormal temperature is detected by the temperature sensor 6 so that the error amplifier 7 outputs the abnormal temperature detecting signal to the driver 5. Upon receiving the abnormal temperature detecting signal, the driver 5 switches the output voltage level of the driver 5 from "H" to "L" in case of the on-off control system, for example, to turn off the power device 1. In the case of the pulse width modulation control system, on the other hand, the driver 5 modulates the pulse width of the output of the driver 5 to lower the output of the power device 1. Thus, the temperature of the power device 1 is lowered to prevent thermal breakdown. The diode 3 of the power device is adapted to bypass a current flowing in the power device 1 by counter-electromotive force of the inductive load 4 when the transistor 2 is turned off.

In the conventional temperature protection network for a power device. However, the temperature sensor 6 such as a thermocouple is separately provided exterior to the power device as hereinabove described, whereby the device is enlarged in size to increase the cost. Further, an error between the measuring temperature of the temperature sensor 6 and the actual temperature of the power device 1 is largely dispersed depending on conditions such as heat sink and the mounting position of the temperature sensor 6, to thereby decrease the reliability of the prevention of thermal breakdown of the power device 1.

SUMMARY OF THE INVENTION

The present invention is directed to a semiconductor device which is employed for high power use and a method of manufacturing the same.

A semiconductor device according to a first embodiment is provided with a temperature detecting device on the same semiconductor substrate as a power device for detecting the temperature of the power device through temperature dependency of a p-n junction portion.

A second aspect of the invention provides a method of manufacturing a semiconductor device comprising a power device formed by a field effect transistor and a temperature detecting device formed by a bipolar transistor, which method comprises the following first to seventh steps: In a first step, a first conductivity type epitaxial layer of low impurity concentration is formed on a first conductivity type semiconductor substrate of high impurity concentration, and a second conductivity type impurity is introduced into a power device element region and a temperature detecting device element region on an upper layer part of the epitaxial layer thereby to form second conductivity type first and second high impurity concentration regions. In a second step, a first insulation layer is formed on major surfaces of the first conductivity type epitaxial layer of low impurity concentration and the second conductivity type first and second high impurity concentration regions, and a polysilicon layer is formed on the first insulation layer while avoiding the source region of the power device and the emitter and collector regions of the temperature detecting device. In a third step, the polysilicon layer is utilized as a mask to introduce second conductivity type impurity into the upper layer part of the epitaxial layer through the first insulation layer, thereby to form a second conductivity type first medium impurity concentration region for serving as a channel region of the power device and a second conductivity type second medium impurity concentration region for serving as a base region of the temperature detecting device. In a fourth step, a region of the first insulation layer other than a region corresponding to the polysilicon layer formed in the second step is removed and the remaining first insulation layer is utilized as a mask to introduce a first conductivity type impurity into upper layer parts of the second conductivity type first and second medium impurity concentration regions thereby to form a first conductivity type first high impurity concentration region serving as a source region of the power device and first conductivity type second and third high impurity concentration regions serving as emitter and collector regions of the temperature detecting device respectively. In a fifth step, the polysilicon layer formed in a region other than a gate region of the power device element region is removed and the first insulation layer formed on the second conductivity type first and second medium impurity concentration regions is removed. In a sixth step, a second insulation layer is formed on the chip upper surface, and contact holes are formed to expose a region extending over the second conductivity type first medium impurity concentration region and the first conductivity type first high impurity concentration region of the power device element region and the first conductivity type second high impurity concentration region, the second conductivity type second medium impurity concentration region and the first conductivity type third high impurity concentration region of the temperature detecting device element region respectively. In a seventh step, a first interconnection layer is formed to be connected to the region extending over the second conductivity type first medium impurity concentration region and the first conductivity type first high impurity concentration region and the first conductivity type second high impurity concentration region through the contact holes, and a second interconnection layer is formed to be connected to the second conductivity type second medium impurity concentration region through the contact hole while a third interconnection layer is formed to be connected to the first conductivity type third high impurity concentration region through the contact hole.

A third aspect of the invention provides a method of manufacturing a semiconductor device comprising a power device formed by a field effect transistor and a temperature detecting device formed by a MOS field effect transistor, which method comprises the following first to seventh steps: In a first step, a first conductivity type epitaxial layer of low impurity concentration is formed on a first conductivity type semiconductor substrate of high impurity concentration and a second conductivity type impurity is introduced into a power device element region and a temperature detecting device element region on an upper layer part of the epitaxial layer respectively thereby to form second conductivity type first and second high impurity concentration regions. In a second step, a first insulation layer is formed on major surfaces of the first conductivity type epitaxial layer of low impurity concentration and the second conductivity type first and second high impurity concentration regions and a polysilicon layer is formed on the first insulation layer while avoiding a source region of the power device and source and drain regions of the temperature detecting device respectively. In a third step, the polysilicon layer is utilized as a mask to introduce a second conductivity type impurity into the upper layer part of the epitaxial layer through the first insulation layer, thereby to form a second conductivity type first medium impurity concentration region for serving as a channel region of the power device and a second conductivity type second medium impurity concentration region for serving as a channel region of the temperature detecting device. In a fourth step, a region of the first insulation layer other than a region corresponding to the polysilicon layer formed in the second step is removed and the remaining first insulation layer is utilized as a mask to introduce a first conductivity type impurity into upper layer parts of the second conductivity type first and second medium impurity concentration regions, thereby to form a first conductivity type first high impurity concentration region for serving as a source region of the power device and first conductivity type second and third high impurity concentration regions for serving as source and drain regions of the temperature detecting device respectively. In a fifth step, the polysilicon layer formed on regions of the power device element region and the temperature detecting device element region other than the gate regions thereof is removed and thereafter the first insulation layer formed on the second conductivity type first medium impurity concentration region is removed. In a sixth step, a second insulation layer is formed on the chip upper surface and thereafter contact holes are formed to expose a region extending over the second conductivity type first medium impurity concentration region and the first conductivity type first high impurity concentration region of the power device element region and the first conductivity type second high impurity concentration region and the first conductivity type third high impurity concentration region of the temperature detecting device element region respectively. In a seventh step, a first interconnection layer is formed to be connected to the region extending over the second conductivity type first medium impurity concentration region and the first conductivity type first high impurity concentration region and the first conductivity type second high impurity concentration region through the contact holes, and a second interconnection layer is formed to be connected to the first conductivity type third high impurity concentration region through the contact hole.

A fourth aspect of the invention provides a method of manufacturing a semiconductor device comprising a power device formed by a field effect transistor and a temperature detecting device formed by a diode, which method comprises the following first to seventh steps: in a first step, a first conductivity type epitaxial layer of low impurity concentration is formed on a first conductivity type semiconductor substrate of high impurity concentration, and a second conductivity type impurity is introduced into a power device element region and a temperature detecting device element region on an upper layer part of the epitaxial layer, thereby to form second conductivity type first and second high impurity concentration regions. In a second step, a first insulation layer is formed on major surfaces of the first conductivity type epitaxial layer of low impurity concentration and the second conductivity type first and second high impurity concentration regions, and a polysilicon layer is formed on the first insulation layer while avoiding a source region of a power device and a first conductivity region of a temperature detecting device. In a third step, the polysilicon layer is utilized as a mask to introduce a second conductivity type impurity into the upper part of the epitaxial layer through the first insulation layer, thereby to form a second conductivity type first medium impurity concentration region for serving as a channel region of the power device and a second conductivity type second medium impurity concentration region for serving as a second conductivity region of the temperature detecting device. In a fourth step, a region of the first insulation layer other than a region corresponding to the polysilicon layer formed in the second step is removed and the remaining first insulation layer is utilized as a mask to introduce a first conductivity type impurity into upper layer parts of the second conductivity type first and second medium impurity concentration regions, thereby to form a first conductivity type first high impurity concentration region for serving as a source region of the power device and a first conductivity type second high impurity concentration region for serving as a first conductivity region of the temperature detecting device. In a fifth step, the polysilicon layer formed in a region other than a gate region of the power device element region is removed, and thereafter the first insulation layer formed on the second conductivity type first medium impurity concentration region is removed. In a sixth step, a second insulation layer is formed on the chip upper surface and thereafter contact holes are formed to expose a region extending over the second conductivity type first medium impurity concentration region and the first conductivity type first high impurity concentration region of the power device element region and the first conductivity type second high impurity concentration region and the second conductivity type second medium impurity concentration region of the temperature detecting device element region respectively. In a seventh step, a first interconnection layer is formed to be connected to the region extending over the second conductivity type first medium impurity concentration region and the first conductivity type first high impurity concentration region and the first conductivity type second high impurity concentration region through the contact holes, and a second interconnection layer is formed to be connected to the second conductivity type second medium impurity concentration region through the contact hole.

Accordingly, a principal object of the present invention is to provide a small-sized and low-priced semiconductor device which can reliably prevent thermal breakdown of a power device, and a method of manufacturing the same.

According to the present invention, a temperature detecting device is formed on a semiconductor substrate which is provided with a power device so that there is no need to provide an exterior temperature sensor, whereby the device can be decreased in size and cost. Further, an abnormal temperature of the power device can be accurately detected by the temperature detecting device, thereby to reliably prevent thermal breakdown of the power device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
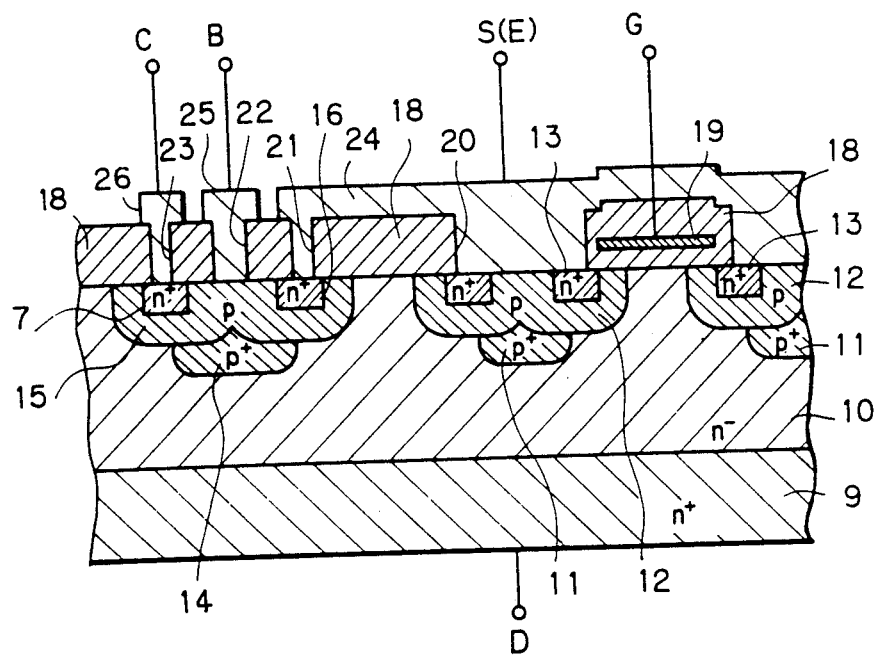
FIG. 1 is a sectional view showing a semiconductor device according to an embodiment of the present invention.

FIG. 1 is a sectional view showing a semiconductor device according to an embodiment of the present invention. This semiconductor device is provided on a single chip with a power device formed by an n-channel enhancement field effect transistor and a temperature detecting device formed by an npn bipolar transistor. Namely, an $n^-$-type epitaxial layer 10 is formed on an $n^+$-type semiconductor substrate 9 in this semiconductor device. A $p^+$-type region 11, a p-type region 12 for serving as a channel region and an $n^+$-type region 13 for serving as a source region are formed on a power device element region in an upper layer part of the $n^-$-type epitaxial layer 10. Further, a $p^+$-type region 14, a p-type region 15 for serving as a base region, an $n^+$-type region 16 for serving as an emitter region and an $n^+$-type region 17 for serving as a collector region are formed as a temperature detecting device element region in the upper layer part of the $n^-$-type epitaxial layer 10. An insulation layer 18 of $SiO_2$ is formed on respective major surfaces of the $n^-$-type epitaxial layer 10, the p-type regions 12 and 15 and the $n^+$-type regions 13, 16 and 17. A polysilicon layer 19 for a gate electrode is formed in a part of the insulation layer 18 in the power device element region. Contact holes 20, 21, 22 and 23 are formed in the insulation layer 18 respectively. The p-type region 12 and the $n^+$-type region 13 of the power device element region are connected with a source terminal S by an Al interconnection layer 24 through the contact hole 20, while the $n^+$-type region 16 of the temperature detecting device element region is connected to the source terminal S similarly by the Al interconnection layer 24 through the contact hole 21. The p-type region 15 of the temperature detecting device element region is connected to a base terminal B by an Al interconnection layer 25 through the contact hole 22, while the $n^+$-type region 17 is connected to a collector terminal C by an Al interconnection layer 26 through the contact hole 23. A gate terminal G of the power device is connected to the polysilicon layer 19, and a drain terminal D is connected to the $n^+$-type semiconductor substrate 9.

Figure 2:
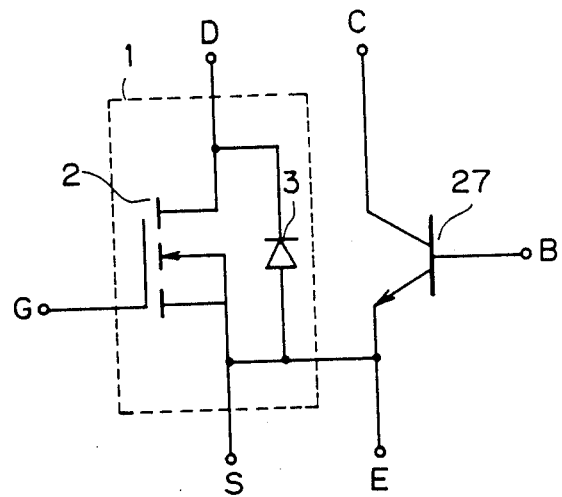
FIG. 2 is illustrative of an equivalent circuit of FIG. 1.

FIG. 2 shows an equivalent circuit of the semiconductor device of such structure. As obvious from FIGS. 1 and 2, the temperature detecting device 27 is formed by an npn bipolar transistor consisting of the $n^+$-region 17, the p-type region 15 and the $n^+$-type region 16. The power device 1 is formed by an n-channel enhancement field effect transistor 2 consisting of the $n^+$-type region 13, the p-type region 12, the n⁻-type epitaxial layer 10, the n⁺-type semiconductor substrate 9 and the polysilicon layer 19 and a diode 3 consisting of the p-type region 12, the p⁺-type region 11. The n⁻-type epitaxial layer 10 and the n⁺-type semiconductor substrate 9.

Figure 3:
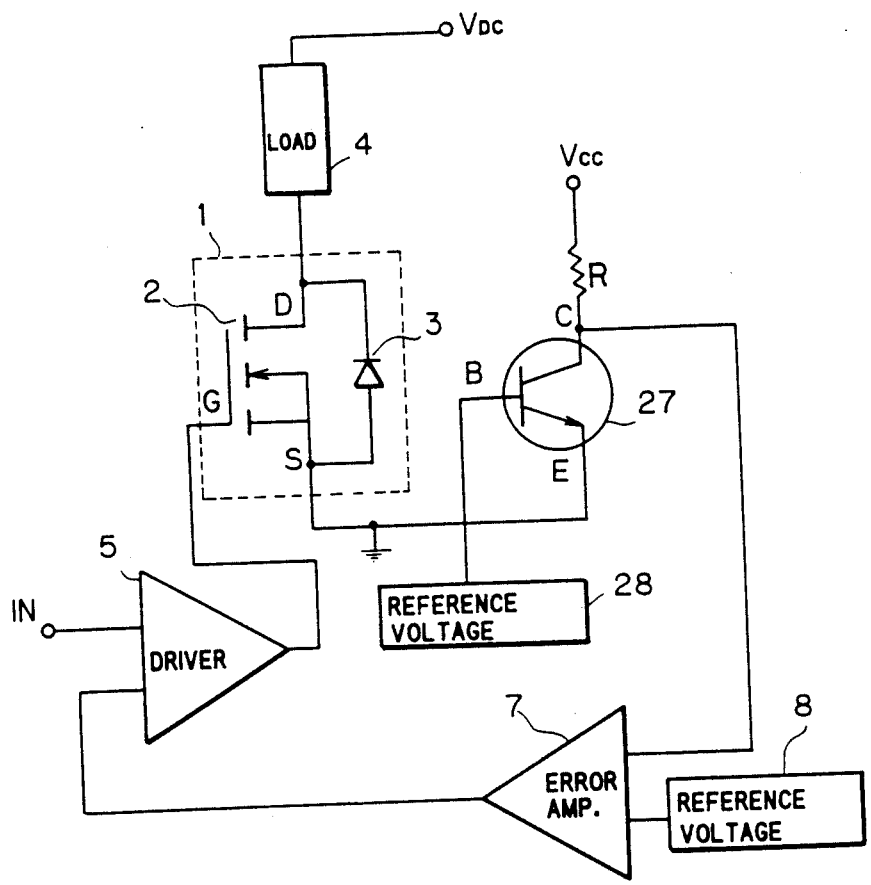
FIG. 3 shows circuit structure of the semiconductor device as shown in FIG. 1 in actual employment.
Figure 20:
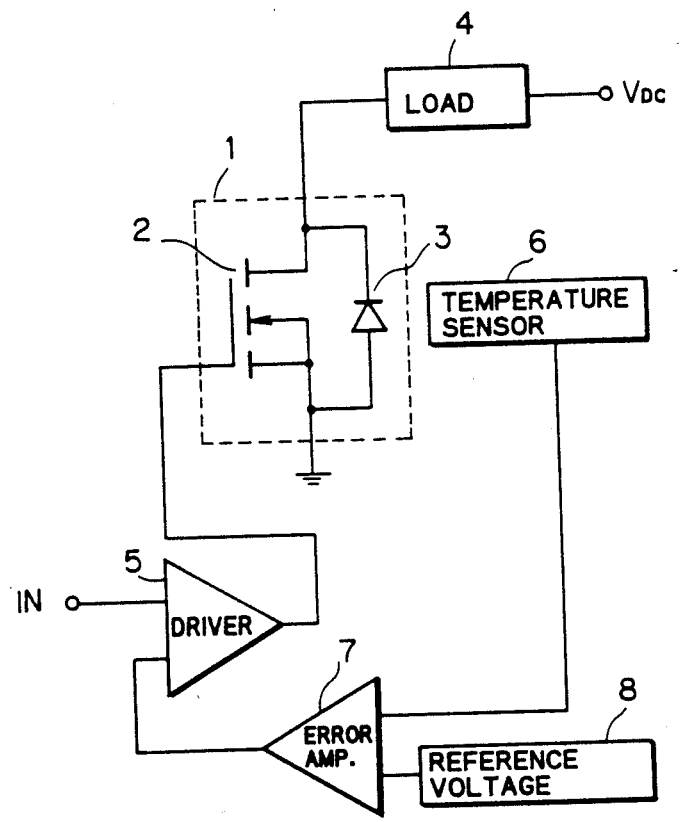
FIG. 20 illustrates circuit structure of a conventional semiconductor device in actual employment.

FIG. 3 illustrates circuit structure of the aforementioned semiconductor device in actual employment. As shown in FIG. 3, the drain terminal D of the power device 1 is connected to a DC power supply $V_{DC}$ through a load 4 and the gate terminal G is connected to an output side of a driver 5, while the source terminal is commonly grounded with an emitter terminal E of the temperature detecting device 27. Reference voltage 28 is applied to the base terminal B of the temperature detecting device 27, whose collector terminal C is connected to a power supply $V_{CC}$ through a resistor R. Voltage of the collector terminal C is applied to one input terminal of an error amplifier Other structure is similar to that of the prior art example as shown in FIG. 20.

Figure 4:
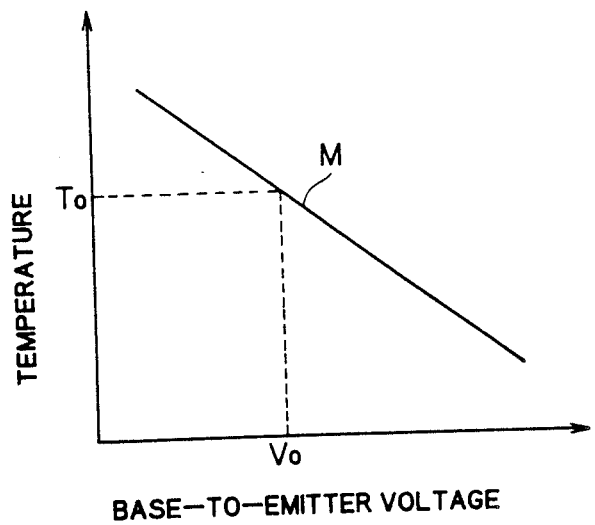
FIG. 4 is a characteristic diagram showing relation between base-to-emitter voltage and temperature.

FIG. 4 shows relation between base-to-emitter voltage drop of the temperature detecting device 27 and the temperature by a straight line M, and it is well known that the base-to-emitter voltage drop is lowered as the temperature is increased.

In this embodiment, therefore, a voltage value $V_0$ (FIG. 4) corresponding to an abnormal detecting temperature $T_0$ (FIG. 4) of the power device 1 is supplied to the base terminal B as the reference voltage 28, in due consideration of the aforementioned temperature dependency of the temperature detecting device 27.

Operation of the temperature protection network of such a structure is as follows: When the power device 1 is in a normal temperature range, the temperature of the temperature detecting device 27 is lower than the abnormal detecting temperature $T_0$ as shown in FIG. 4, and hence the base-to-emitter voltage drop of the temperature detecting device 27 is higher than the voltage value $V_0$ of the reference voltage 28. Therefore, the temperature detecting device 27 is in a cutoff state and the potential of the power supply $V_{CC}$ is directly applied to the first input terminal of the error amplifier 7, which outputs no abnormal temperature detecting signal. Thus, a control signal IN directly passes through the driver 5 to be supplied to the gate of the transistor 2, thereby to continue operation by the power device 1. Then, when the power device 1 generates heat so that its temperature rises to the abnormal detecting temperature $T_0$, the temperature detecting device 27 formed on the same chip with the power device is also increased to the abnormal detecting temperature $T_0$, whereby the base-to-emitter voltage drop of the temperature detecting device 27 is lowered to the voltage value $V_0$ of the reference voltage 28, to allow conduction of the temperature detecting device 27. Because of a conduction of the temperature detecting device 27, a voltage having a value equal to $V_{CC}$ minus the voltage drop by the resistor R is inputted into the error amplifier 7, which in turn outputs an abnormal temperature detecting signal to the driver 5. Upon receipt of the abnormal temperature detecting signal, the driver 5 switches the output voltage level of the driver 5 from "H" to "L" to turn off the power device 1 in the instance where an on-off control system is used, for example, while modulating the pulse width of the output of the driver 5 to lower output of the power device 1 in the instance where a pulse width modulation control system is used. Thus, the temperature of the power device 1 is lowered to prevent thermal breakdown.

According to the semiconductor device of this embodiment as hereinabove described, the temperature detecting device 27 is formed on the same substrate with the power device 1 and hence there is no need to add an exterior temperature sensor as in the conventional case, whereby the device can be decreased in size and cost. Further, since the temperature detecting device 27 is formed on the same substrate with the power device 1, abnormal temperature rise of the power device can be accurately detected by the temperature detecting device 27, thereby to reliably prevent thermal breakdown of the power device 1.

Figure 8:
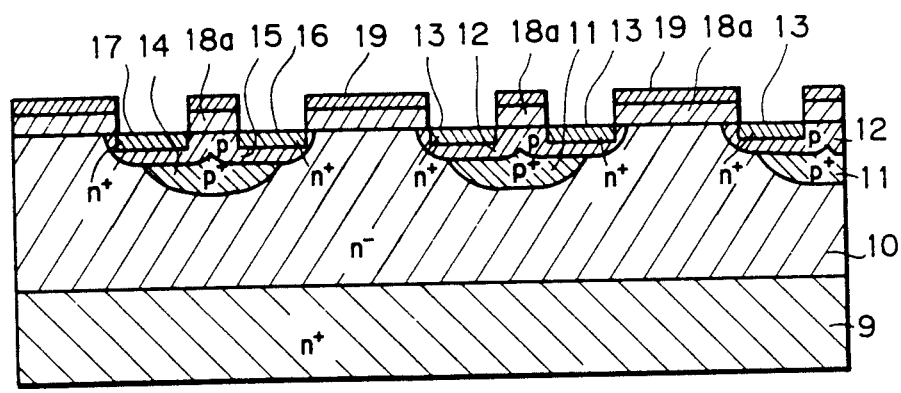

Description will now be made with regard to the method of manufacturing the aforementioned semiconductor device. As shown in FIG. 8, an n⁻-type epitaxial layer 10 is first formed on an n⁺-type semiconductor substrate 9, and an SiO₂ layer 29 having cavities 29a is formed on the n⁻-type epitaxial layer 10. A p-type Impurity is ion-implanted into the upper layer part of the n⁻-type epitaxial layer 10 through thin film portions in the cavities 29a of the SiO₂ layer 29, to thereby form p⁺-type regions 11 and 14 in a power device element region and a temperature detecting device element region on the upper layer portion of the n⁻-type epitaxial layer 10 respectively.

Figure 6:
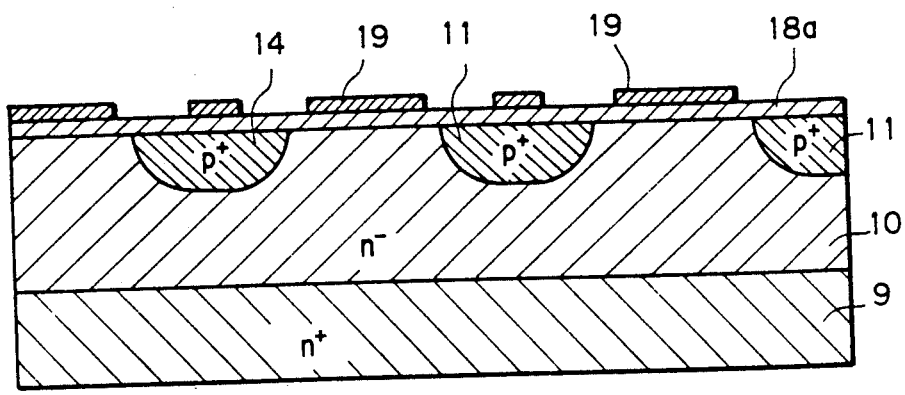

Then the SiO₂ layer 29 is removed and an insulation layer 18a of SiO₂ is formed on the major surfaces of the n⁻-type epitaxial layer 10 and the p⁺-type regions 11 and 14 as shown in FIG. 6. Thereafter a polysilicon layer 19 is deposited on the Insulation layer 18a, and parts of the polysilicon layer 19 corresponding to a source region of a power device and emitter and collector regions of a temperature detecting device are removed by etching.

Figure 7:
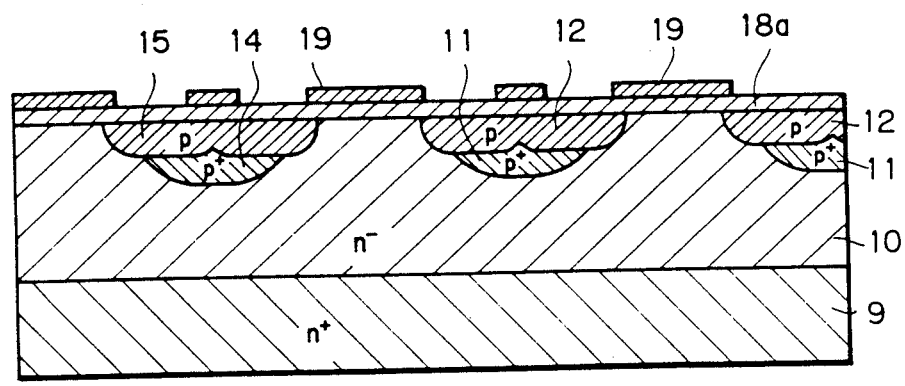

Then, as shown in FIG. 7, the polysilicon layer 19 is utilized as a mask to ion-implant a p-type impurity into the upper layer part of the n⁻-type epitaxial layer 10 through the insulation layer 18a, to thereby form a p-type region 12 serving as a channel region of the power device and a p-type region 15 serving as a base region of the temperature detecting device.

Thereafter a region of the insulation layer 18a, other than the region corresponding to the polysilicon layer 19, is removed by etching. Then, as shown in FIG. 8, the remaining insulation layer 18a is utilized as a mask to introduce an n-type impurity into the upper layer portions of the p-type regions 12 and 15, to thereby form an n⁺-type region 13 serving as a source region of the power device and n⁺-type regions 16 and 17 serving as emitter and collector regions of the temperature detecting device.

Figure 9:
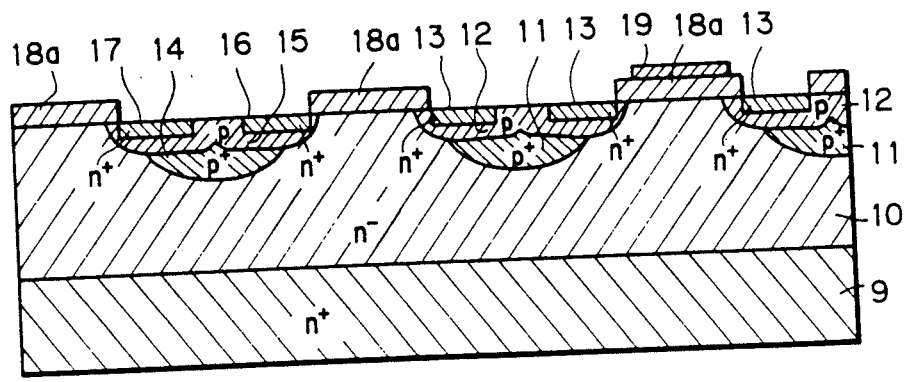

Then, as shown in FIG. 9, the polysilicon layer 19 formed on a region, other than the gate region of the power device element region, is removed, and thereafter the insulation layer 18a formed on the p-type regions 12 and 15 is removed. Subsequently, an insulation layer 18b of SiO₂ is formed over the entire chip upper surface as shown in FIG. 10, and contact holes 20, 21, 22 and 23 are formed to expose a region extending over the p-type region 12 and the n⁺-type region 1S of the power device element region and the n⁺-type region 16, the p-type region 15 and the n⁺-type region 17 of the temperature detecting device element region respectively.

Figure 11:
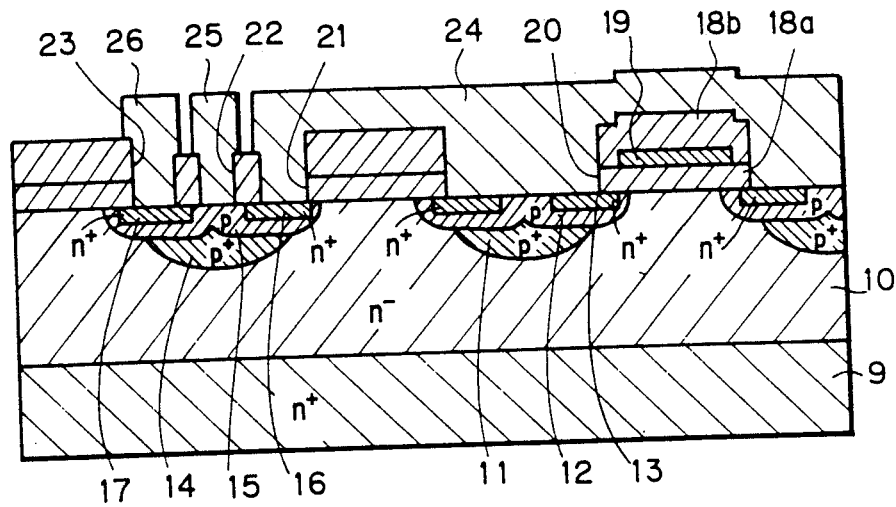

Finally an Al interconnection layer 24 is formed so as to be connected to the region extending over the p-type region 12 and the n⁺-type region 13 and the n⁺-type region 16 through the contact holes 20 and 21, as shown in FIG. 11. Further, an Al interconnection layer 25 is formed so as to be connected to the p-type region 15 through the contact hole 22. In addition, an Al interconnection layer 26 is formed to be connected to the n+-type region 17 through the contact hole 23. Thus, the semiconductor device as shown in FIG. 1 is completely manufactured.

Figure 5:
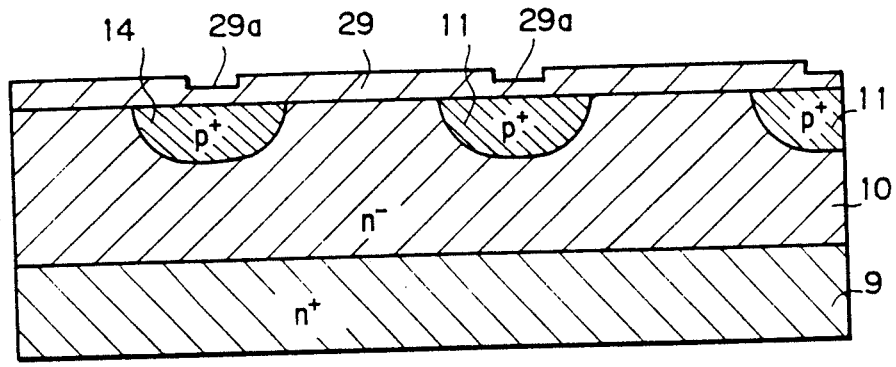
FIGS. 5 to 11 are sectional views showing steps of manufacturing the semiconductor device as shown in FIG. 1.
Figure 10:
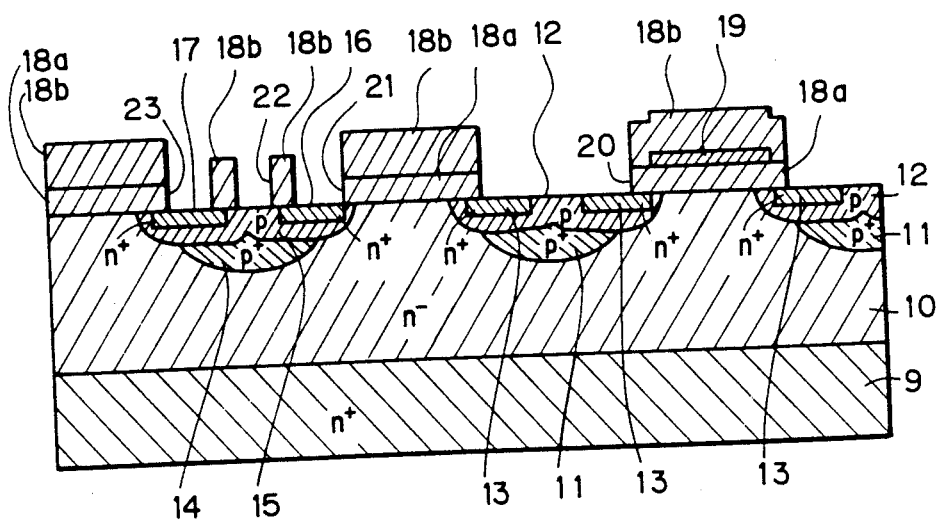

In the aforementiond manufacturing steps, FIG. 5 shows the first step, FIG. 6 shows the second step, FIG. 7 shows the third step, FIG. 8 shows the fourth step, FIG. 9 shows the fifth step, FIG. 10 shows the sixth step and FIG. 11 shows the seventh step respectively.

As obvious from the aforementioned manufacturing steps, the temperature detecting device 27 and the power device 1 can be formed by the same step in the semiconductor device of this embodiment, and the manufacturing steps are not increased as compared with the prior art.

Figure 12:
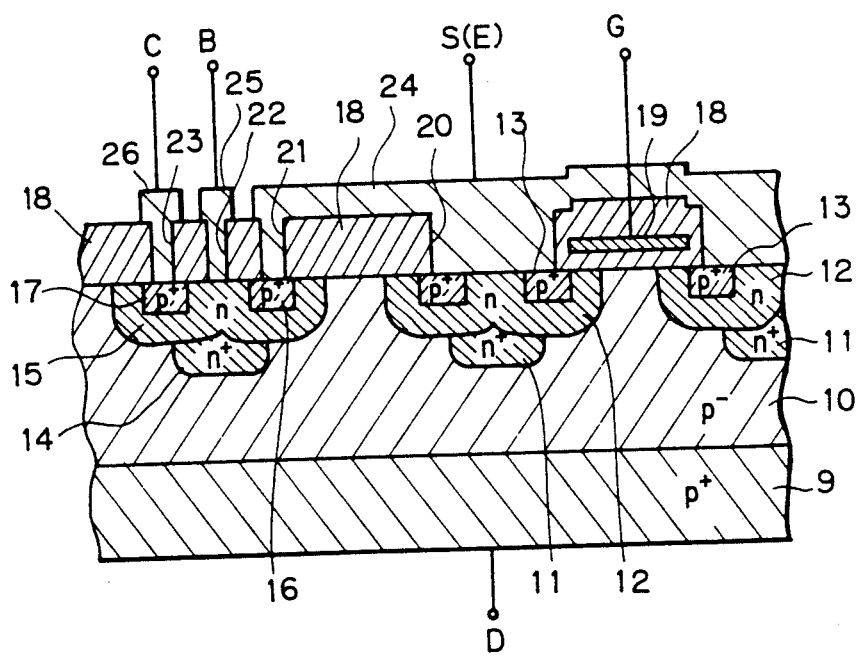
FIG. 12 is a sectional view showing a semiconductor device according to a second embodiment of the present invention.

FIG. 12 is a sectional view showing a semiconductor device according to a second embodiment of the present invention. This embodiment is obtained by inverting the semiconductor device in p-n polarity as shown in FIG. 1. Other structure is similar to that of the first embodiment, and the second embodiment can attain an effect similar to that of the first embodiment.

A power device employable in the present invention is not restricted to the field effect transistor as hereinabove described, but may be prepared by a bipolar transistor, or an insulated gate bipolar mode transistor such as an IGBT.

Figure 13:
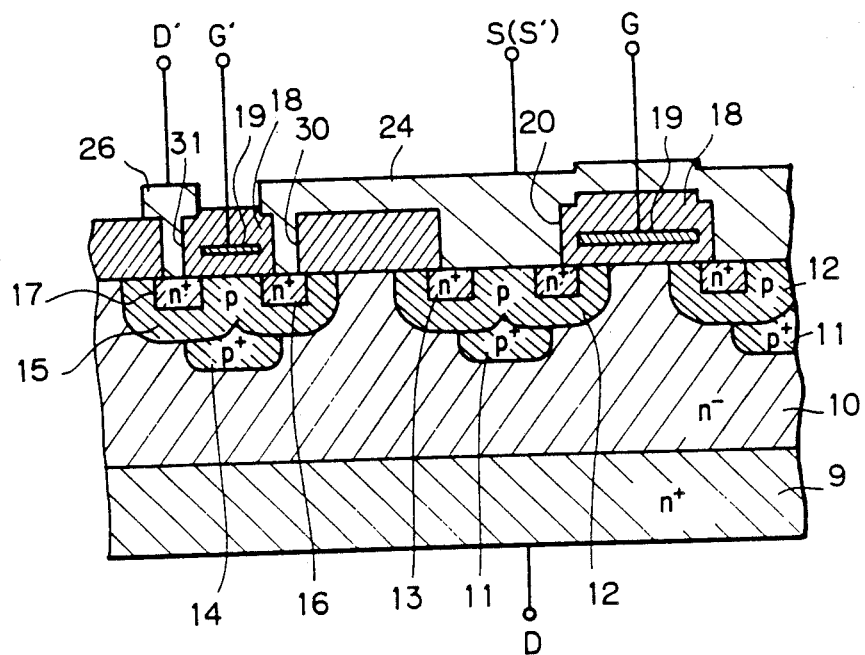
FIG. 13 is a sectional view showing a semiconductor device according to a third embodiment of the present invention.

FIG. 13 is a sectional view showing a semiconductor device according to a third embodiment of the present invention. This semiconductor device is different from the first embodiment in that a temperature detecting device is prepared by an n-channel MOS field effect transistor of lateral structure. In this embodiment, a p-type region 15 of a temperature detecting device element region is employed as a channel region and a n+-type region 16 is employed as a source region while another n+-type region 17 is employed as a drain region. A polysilicon layer 19 for a gate electrode is formed through an insulation layer 18 on a region of the p-type region 15 between the source and the drain. Contact holes 30 and 31 are formed in the temperature detecting device element region of the insulation layer 18. An Al interconnection layer 24 is connected to the n+-type region 16 through the contact hole 30, and an Al interconnection layer 26 is connected to the n+-type region 17 through the contact hole 31. The polysilicon layer 19 of the temperature detecting device element region is connected to a gate terminal G', while the Al interconnection layer 26 is connected to a drain terminal D'.

Circuit structure of this semiconductor device in actual employment is attained by connecting the drain terminal D', the gate terminal G' and a source terminal S' in place of the collector terminal C, the base terminal B and the emitter terminal E of the temperature detecting device 27 as shown in FIG. 3. Also in this semiconductor device, a relationship similar to the characteristics as shown in FIG. 4 exists between gate-to-source threshold voltage of the temperature detecting device and the temperature, and hence an abnormal temperature is detected by operation similar to that of the first embodiment and a similar effect to the first embodiment is attained.

Figure 14:
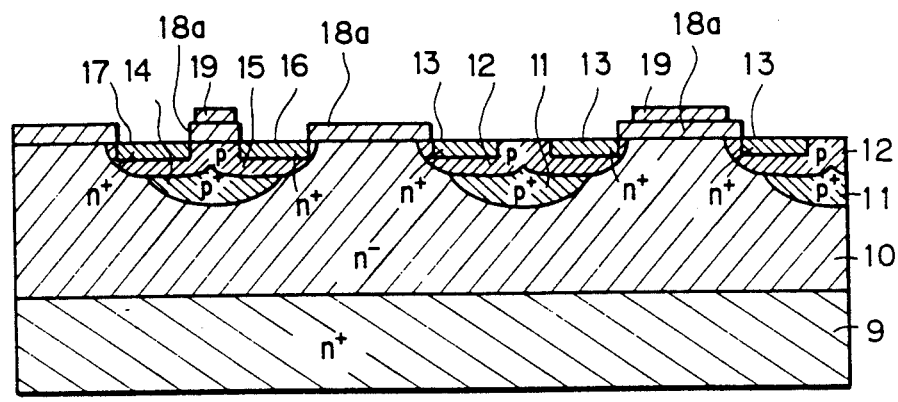
FIGS. 14 and 15 are sectional views showing steps of manufacturing the semiconductor device as shown in FIG. 13.
Figure 15:
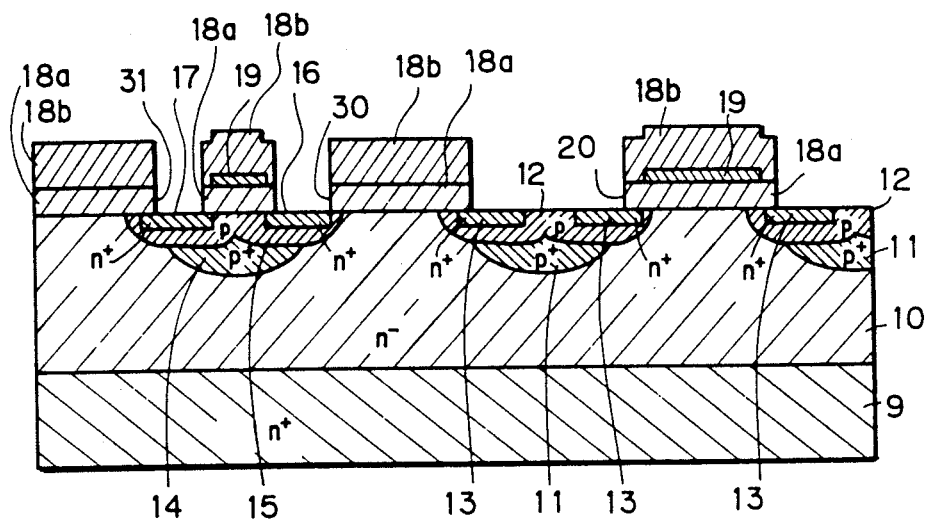

The first four steps of manufacturing the semiconductor device as shown in FIG. 13 are identical to those of the first embodiment as shown in FIGS. 5 to 8. Thereafter in a fifth step, a polysilicon layer 19, which is formed in the vicinity of the power device element region and the temperature detecting device element region except for the gate regions thereof, is removed and an insulation layer 18a formed on a p-type region 12 is also removed, as shown in FIG. 14. In a sixth step, an insulation layer 18b is formed over the entire chip surface and contact holes 20, 30 and 31 are formed to expose a region extending over the p-type region 12 and the n+-type region 13 of the power device element region and n+-type regions 16 and 17 of the temperature detecting device element region respectively, as shown in FIG. 15. Finally in a seventh step, an Al interconnection layer 24 is formed to be connected to the region which extents over the p-type region 12 and the n+-type region 13 through the contact hole 20 while an Al interconnection layer 24 is formed so that it is connected to the n+-type region 16 through the contact hole 30, as shown in FIG. 13. Further, an Al interconnection layer 26 is formed to be connected to the n+-type region 17 through the contact hole 31. Also in the semiconductor device as shown in FIG. 13, the temperature detecting device can be formed in the same step as the formation of the power device, so the manufacturing steps will not be increased when compared with the prior art.

The semiconductor device as shown in FIG. 13 may be inverted in p-n polarity, as a matter of course.

Figure 16:
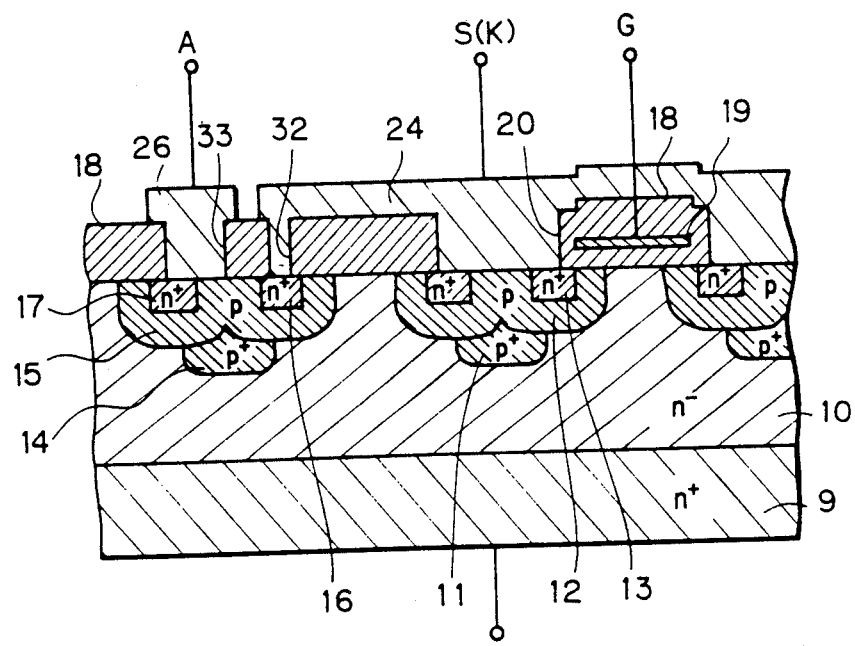
FIG. 16 is a sectional view showing a semiconductor device according to a fourth embodiment of the present invention.

FIG. 16 is a sectional view showing a semiconductor device according to a fourth embodiment of the present invention. This semiconductor device is different from the embodiment as shown in FIG. in that a temperature detecting device is prepared as a diode. In this embodiment, a p-type region 15 of a temperature detecting device element region is employed as an anode region, and an n+-type region 16 is employed as a cathode region. Contact holes 32 and 33 are formed in a temperature detecting device element region of an insulation layer 18. An Al interconnection layer 24 is connected to the n+-type region 16 through the contact hole 32, while an Al interconnection layer 26 is connected to the p-type region 15 and the n+-type region 17 through the contact hole 33. The Al interconnection layer 26 is connected to an anode terminal A.

Circuit structure of this semiconductor device in actual employment is attained by providing a constant current source in place of the power supply $V_{CC}$ and the resistor R of FIG. 3 and connecting the anode terminal A and a cathode terminal K of FIG. 16 in place of the collector terminal C and the emitter terminal E of the temperature detecting device 27. The reference voltage 28 of FIG. 3 is omitted since the same is unnecessary. According to this semiconductor device. The temperature dependency exists in the forward voltage drop of the diode which serves as the temperature detecting device, whereby a voltage change appearing on the anode terminal A following a temperature change is fed to the error amplifier to detect an abnormal temperature of a power device 1, and thereby provide an effect which is analogous to that of the first embodiment.

The semiconductor device as shown in FIG. 16 may be inverted in p-n polarity, as a matter of course. In this case, the region 16 is employed as an anode region, and the region 15 is employed as a cathode region.

Figure 17:
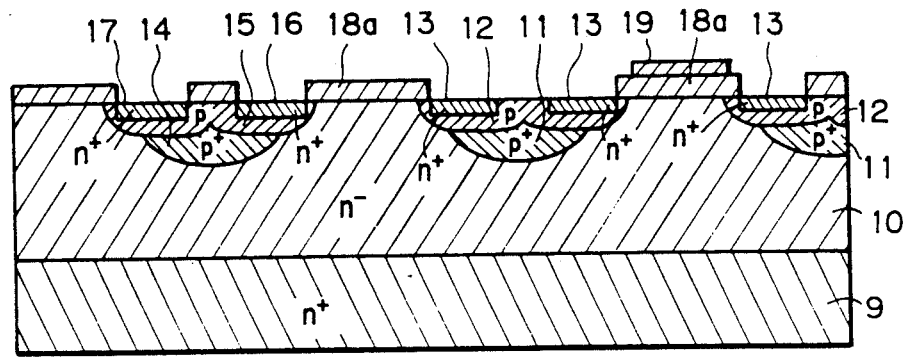
FIGS. 17 and 18 are sectional views showing steps of manufacturing the semiconductor device as shown in FIG. 16.
Figure 18:
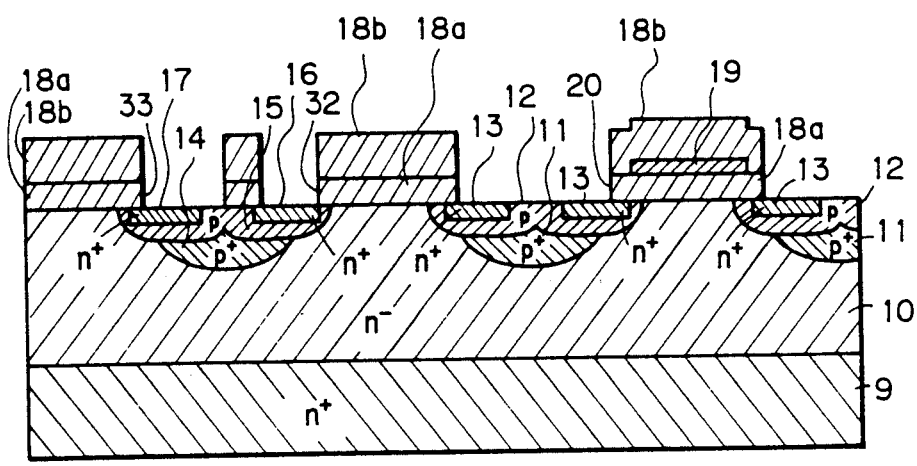

Once again, the first four steps of manufacturing the semiconductor device as shown in FIG. 16 are identical to those of the first embodiment as shown in FIGS. 5 to 8. In a fifth step, a polysilicon layer 19, formed in a region other than a gate region of a power device element region, is removed and thereafter an insulation layer 18a formed on a p-type region 12 is removed, as shown in FIG. 17. Then, in a sixth step, an insulation layer 18b is formed over the entire chip surface, and thereafter contact holes 20, 32 and 33 are formed to expose a region extending over the p-type region 12 and an n+-type region 13 of the power device element region, and to explore an n+-type region 16 and a region extending over the p-type region 15 and an n+-type region 17 in a temperature detecting device element region respectively, as shown in FIG. 18. Finally in a seventh step, an Al interconnection layer 24 is formed to be connected to the region extending over the p-type region 12 and the n+-type region 13 through the contact hole 20 as well as to the n+-type region 17 through the contact hole 32, as shown in FIG. 16.

Further, an Al interconnection layer 26 is formed to be connected to the region extending over the p-type region 15 and semiconductor device as shown in FIG. 16, the temperature detecting device can be formed in the same step as the formation of the power device, so that the number of manufacturing steps will not be increased as compared with the prior art. Referring to FIG. 16. The n+-type region 17 of the temperature detecting device element region can be omitted since this region 17 is not a necessity.

In each of the aforementioned embodiments, a grounded-side electrode (source electrode in FIG. 1, 13 or 16) of the power device and a grounded-side electrode (emitter electrode in FIG. 1, source electrode in FIG. 13 or cathode electrode in FIG. 16) of the temperature detecting device are commonly connected to the Al interconnection layer 24 to be grounded, in order to implement the device with a higher density of integration. However, the grounded-side electrode of the power device and that of the temperature detecting device may be independently grounded through different interconnection layers.

Figure 19:
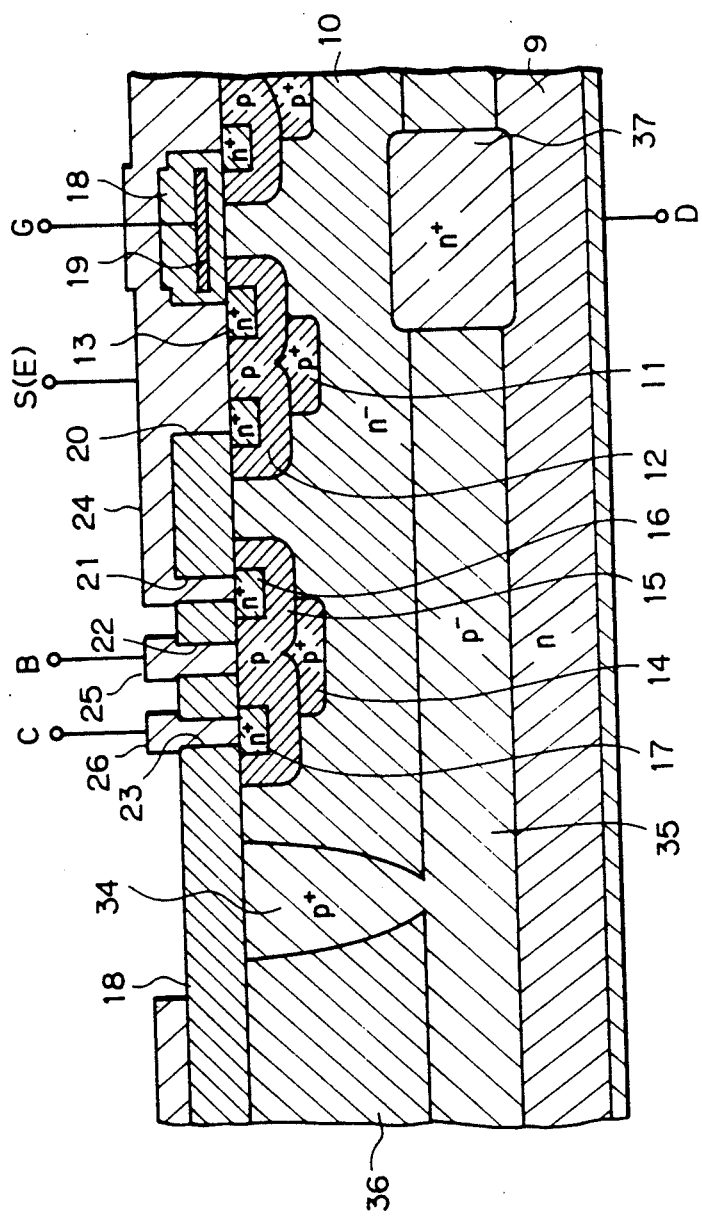
FIG. 19 is a sectional view showing a semiconductor device according to a fifth embodiment of the present invention.

FIG. 19 is a sectional view showing a semiconductor device according to a fifth embodiment of the present invention. In this semiconductor device, a single chip is provided thereon with a power device and a temperature detecting device, as well as a control circuit portion for performing voltage control of the power device on the basis of a temperature detecting signal from the temperature detecting device. That is, a control circuit portion, corresponding to the driver 5, the error amplifier 7, the resistor R etc. of FIG. 3, is formed as an integrated circuit in a region 36 separated by a p+-type element isolation region 34 and a p−-type interlayer isolation region 35 as shown in FIG. 19. An n−-type epitaxial layer 10, which is provided with the power device and the temperature detecting device, is connected with an n+-type semiconductor substrate through an n+-type region 37. The other structure is similar to that of the embodiment as shown in FIG. 1, and a similar effect is attained. Although FIG. 19 shows the instance where the power device is prepared by an n-channel enhancement field effect transistor and the temperature detecting device is prepared by an npn bipolar transistor, other types of power devices and temperature detecting devices may be formed on the n−-type epitaxial layer 10, as a matter of course.

Although the present invention has been described and illustrated in detail, it is clearly understood that the same is by wall of illustration and example only and is not to be taken by way of limitation, the spirit and scope of the present invention being limited only by the terms of the appended claims.

What is claimed is:

1. A method of manufacturing, on a single chip, a semiconductor device having a power device formed by a field effect transistor and a temperature detecting device formed by a bipolar transistor, said method comprising:

a first step of forming a first conductivity type epitaxial layer of low impurity concentration on a first conductivity type semiconductor substrate of high impurity concentration and introducing a second conductivity type impurity into both a power device element region and a temperature detecting device element region both regions being on an upper layer part of said epitaxial layer respectively thereby to form second conductivity type first and second high impurity concentration regions;

a second step of forming a first insulation layer on major surfaces of said first conductivity type epitaxial layer of low impurity concentration and said second conductivity type first and second high impurity concentration regions and forming a polysilicon layer on said first insulation layer while avoiding a source region of a power device and emitter and collector regions of a temperature detecting device;

a third step of utilizing said polysilicon layer as a mask to introduce a second conductivity impurity into said upper layer part of said epitaxial layer through said first insulation layer thereby to form a second conductivity type first medium impurity concentration region serving as a channel region of said power device and a second conductivity type second medium impurity concentration region serving as a base region of said temperature detecting device;

a fourth step of removing a region of said first insulation layer other than a region corresponding to said polysilicon layer formed by said second step and utilizing remaining said first insulation layer as a mask to introduce a first conductivity type impurity into upper layer parts of said second conductivity type first and second medium impurity concentration regions thereby to form a first conductivity type first high impurity concentration region for serving as a source region of said power device and first conductivity type second and third high impurity concentration regions for serving as emitter and collector regions of said temperature detecting device respectively;

a fifth step of removing said polysilicon layer formed on a region other than a gate region of said power device element region and thereafter removing said first insulation layer formed on said second conductivity type first and second medium impurity concentration regions;

a sixth step of forming a second insulation layer on the upper surface of said chip and thereafter forming contact holes to expose a region extending over said second conductivity type first medium impurity concentration region and said first conductivity type first high impurity concentration region of said power device element region and said first conductivity type second high impurity concentration region, said second conductivity type second medium impurity concentration region and said first conductivity type third high impurity concentration region of said temperature detecting device element region respectively; and a seventh step of forming a first interconnection layer to be connected to said region extending over said second conductivity type first medium impurity concentration region and said first conductivity type first high impurity concentration region and said first conductivity type second high impurity concentration region through said contact holes, a second interconnection layer to be connected to said second conductivity type second medium impurity concentration region through said contact hole, and a third interconnection layer connected to said first conductivity type third high impurity concentration region through said contact hole respectively.

2. A method of manufacturing, on a single chip, a semiconductor device having a power device formed by a field effect transistor and a temperature detecting device formed by a MOS field effect transistor, said method comprising:

a first step of forming a first conductivity type epitaxial layer of low impurity concentration on a first conductivity type semiconductor substrate of high impurity concentration and introducing a second conductivity type impurity into both a power device element region and a temperature detecting device element region both regions being in an upper layer part of said epitaxial layer thereby to form second conductivity type first and second high impurity concentration regions;

a second step of forming a first insulation layer on major surfaces of said first conductivity type epitaxial layer of low impurity concentration and said second conductivity type first and second high impurity concentration regions and forming a polysilicon layer on said first insulation layer while avoiding a source region of a power device and source and drain regions of a temperature detecting device respectively;

a third step of utilizing said polysilicon layer as a mask to introduce a second conductivity type impurity into said upper layer part of said epitaxial layer thereby to form a second conductivity type first medium impurity concentration region serving as a channel region of said power device and a second conductivity type second medium impurity concentration region serving as a channel region of said temperature detecting device;

a fourth step of removing a region of said first insulation layer other than a region corresponding to said polysilicon layer formed by said second step and utilizing remaining said first insulation layer as a mask to introduce a first conductivity type impurity into upper layer parts of said second conductivity type first and second medium impurity concentration regions thereby to form a first conductivity type first high impurity concentration region for serving as a source region of said power device and first conductivity type second and third high impurity concentration regions for serving as source and drain regions of said temperature detecting device respectively;

a fifth step of removing said polysilicon layer formed in regions of said power device element region and said temperature detecting device element region except for gate regions thereof and thereafter removing said first insulation layer formed on said second conductivity type first medium impurity concentration region;

a sixth step of forming a second insulation layer on the upper surface of said chip and thereafter forming contact holes to expose a region extending over said second conductivity type first medium impurity concentration region and said first conductivity type first high impurity concentration region of said power device element region and said first conductivity type second high impurity concentration region and said first conductivity type third high impurity concentration region of said temperature detecting device element region respectively; and a seventh step of forming a first interconnection layer to be connected to said region extending over said second conductivity type first medium impurity concentration region and said first conductivity type first high impurity concentration region and said first conductivity type second high impurity concentration region through said contact holes, and a second interconnection layer connected to said first conductivity type third high impurity concentration region through said contact hole respectively.

3. A method of manufacturing, on a single chip, a semiconductor device having a power device formed by a field effect transistor and a temperature detecting device formed by a diode, said method comprising:

a first step of forming a first conductivity type epitaxial layer of low impurity concentration on a first conductivity type semiconductor substrate of high impurity concentration and introducing a second conductivity type impurity into both a power device element region and a temperature detecting device element region both regions being on an upper layer part of said epitaxial layer thereby to form second conductivity type first and second high impurity concentration regions respectively;

a second step of forming a first insulation layer on major surfaces of said first conductivity type epitaxial layer of low impurity concentration and said second conductivity type first and second high impurity concentration regions and forming a polysilicon layer on said first insulation layer while avoiding a source region of a power device and a first conductivity region of a temperature detecting device respectively;

a third step of utilizing said polysilicon layer as a mask to introduce a second conductivity type impurity into said upper layer part of said epitaxial layer through said first insulation layer thereby to form a second conductivity type first medium impurity concentration region serving as a channel region of said power device and a second conductivity type second medium impurity concentration region serving as a second conductivity region of said temperature detecting device a fourth step of removing a region of said first insulation layer other than a region corresponding to said polysilicon layer formed by said second step and utilizing remaining said first insulation layer as a mask to introduce a first conductivity impurity into upper layer parts of said second conductivity type first and second medium impurity concentration regions thereby to form a first conductivity type first high impurity concentration region for serving as a source region of said power device and a first conductivity type second high impurity concentration region for serving as a first conductivity region of said temperature detecting device;

a fifth step of removing said polysilicon layer formed in a region other than a gate region of said power device element region and thereafter removing said first insulation layer formed on said second conductivity type first medium impurity concentration region:

a sixth step of forming a second insulation layer on the upper surface of said single chip and thereafter forming contact holes to expose a region extending over said second conductivity type first medium impurity concentration region and said first conductivity type first high impurity concentration region of said power device element region, and said first conductivity type second high impurity concentration region and said second conductivity type second medium impurity concentration region of said temperature detecting device element region respectively; and a seventh step of forming a first interconnection layer to be connected to said region extending over said second conductivity type first medium impurity concentration region and said first conductivity type first high impurity concentration region and said first conductivity type second high impurity concentration region through said contact holes, and a second interconnection layer connected to said second conductivity type second medium impurity concentration region through said contact hole respectively.

* * * * *